(12) United States Patent
Kang

(10) Patent No.: US 8,054,709 B2
(45) Date of Patent: Nov. 8, 2011

(54) POWER CONTROL CIRCUIT AND SEMICONDUCTOR MEMORY DEVICE USING THE SAME

(75) Inventor: Tae Jin Kang, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 267 days.

(21) Appl. No.: 12/459,345

(22) Filed: Jun. 30, 2009

(65) Prior Publication Data

US 2010/0135098 A1   Jun. 3, 2010

(30) Foreign Application Priority Data

Dec. 2, 2008 (KR) .................... 10-2008-0121187

(51) Int. Cl.
*G11C 5/14* (2006.01)
(52) U.S. Cl. .................... 365/227; 365/226; 365/228
(58) Field of Classification Search .................. 365/227, 365/226, 228
See application file for complete search history.

(56) References Cited

U.S. PATENT DOCUMENTS

| 6,118,328 A | 9/2000 | Morikawa |
| 6,567,319 B2 * | 5/2003 | Sato et al. ............... 365/189.09 |
| 7,372,746 B2 * | 5/2008 | Kim ............... 365/189.06 |
| 2003/0107416 A1 | 6/2003 | Boucher |

FOREIGN PATENT DOCUMENTS

| KR | 10-2006-0062816 | 6/2006 |
| KR | 10-2007-0063687 | 6/2007 |
| KR | 10-2008-0092537 | 10/2008 |

* cited by examiner

*Primary Examiner* — Son Dinh
*Assistant Examiner* — Nam Nguyen
(74) *Attorney, Agent, or Firm* — John P. White; Cooper & Dunham LLP

(57) ABSTRACT

A semiconductor memory device comprises a power control circuit for outputting a power voltage in a read operation period and a write operation period, and an internal circuit operating by the power voltage supplied thereto.

24 Claims, 6 Drawing Sheets

US 8,054,709 B2

POWER CONTROL CIRCUIT AND SEMICONDUCTOR MEMORY DEVICE USING THE SAME

TECHNICAL FIELD

The present invention relates to a semiconductor memory device, and more particularly, to a semiconductor memory device using a power control circuit.

BACKGROUND

In general, a dynamic random access memory (DRAM) interrupts a power voltage supplied to an internal circuit to reduce unnecessary current consumption when it enters into a deep power down mode or a power down mode.

FIG. 1 is a block diagram illustrating a conventional semiconductor memory device.

Referring to FIG. 1, a semiconductor memory device comprises a control signal generating unit 1 and a PMOS transistor P1.

The control signal generating unit 1 receives a deep power down mode signal DPD and a power down mode signal PWD, and generates a control signal CON, and the PMOS transistor P1 controls the supply of a power voltage VDD in response to the control signal CON. Here, the deep power down mode signal DPD and the power down mode signal PWD are high active signals. Therefore, since the control signal CON is enabled to a high level when a DRAM enters into a deep power down mode or a power down mode, the PMOS transistor P1 is turned off and the power voltage VDD is interrupted.

As described above, the conventional semiconductor memory device interrupts the power voltage supplied to an internal circuit 2 to reduce the current consumption when the DRAM enters into the deep power down mode or the power down mode.

However, in states other than the deep power down mode or the power down mode, unnecessary current consumption can occur since the power voltage VDD is still supplied. In particular, in a case of a mobile DRAM requiring much less current consumption compared to a main memory or a graphic memory, there is a need to reduce the current consumption even in an idle state, in which all banks of the DRAM are precharged, other than the deep power down mode and the power down mode.

BRIEF SUMMARY

In an aspect of this disclosure, there is provided a power control circuit capable of interrupting power supplied to an internal circuit even in a state, in which all banks of the DRAM are precharged, other than the deep power down mode and the power down mode, to thereby reduce current consumption, and a semiconductor memory device using the same.

In an embodiment, a semiconductor memory device comprises a power control circuit for outputting a power voltage in a read operation period, and a write operation period; and an internal circuit operating by the power voltage supplied thereto.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE PREFERRED EMBODIMENTS

Hereinafter, an embodiment of the present invention will be described with reference to accompanying drawings. The embodiment is for illustrative purposes only, and the scope of the present invention is not limited thereto.

Figure 1:
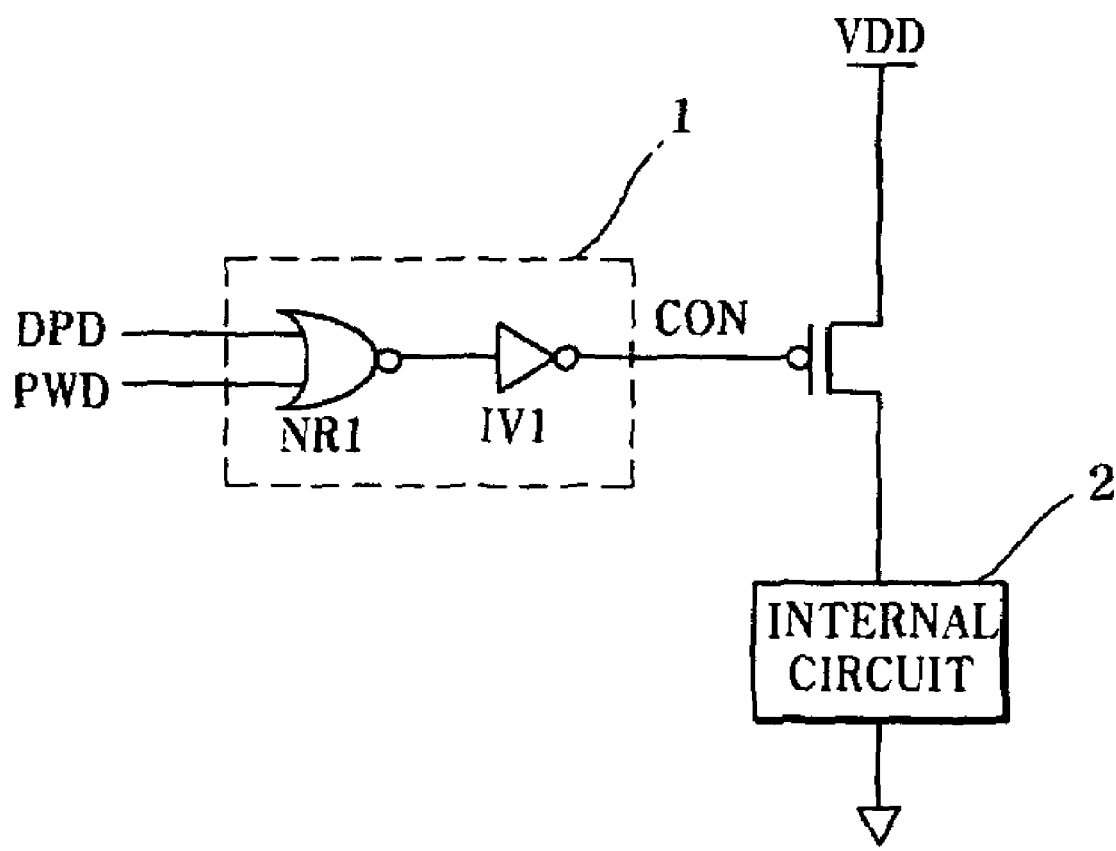
FIG. 1 is a block diagram illustrating a conventional semiconductor memory device.
Figure 2:
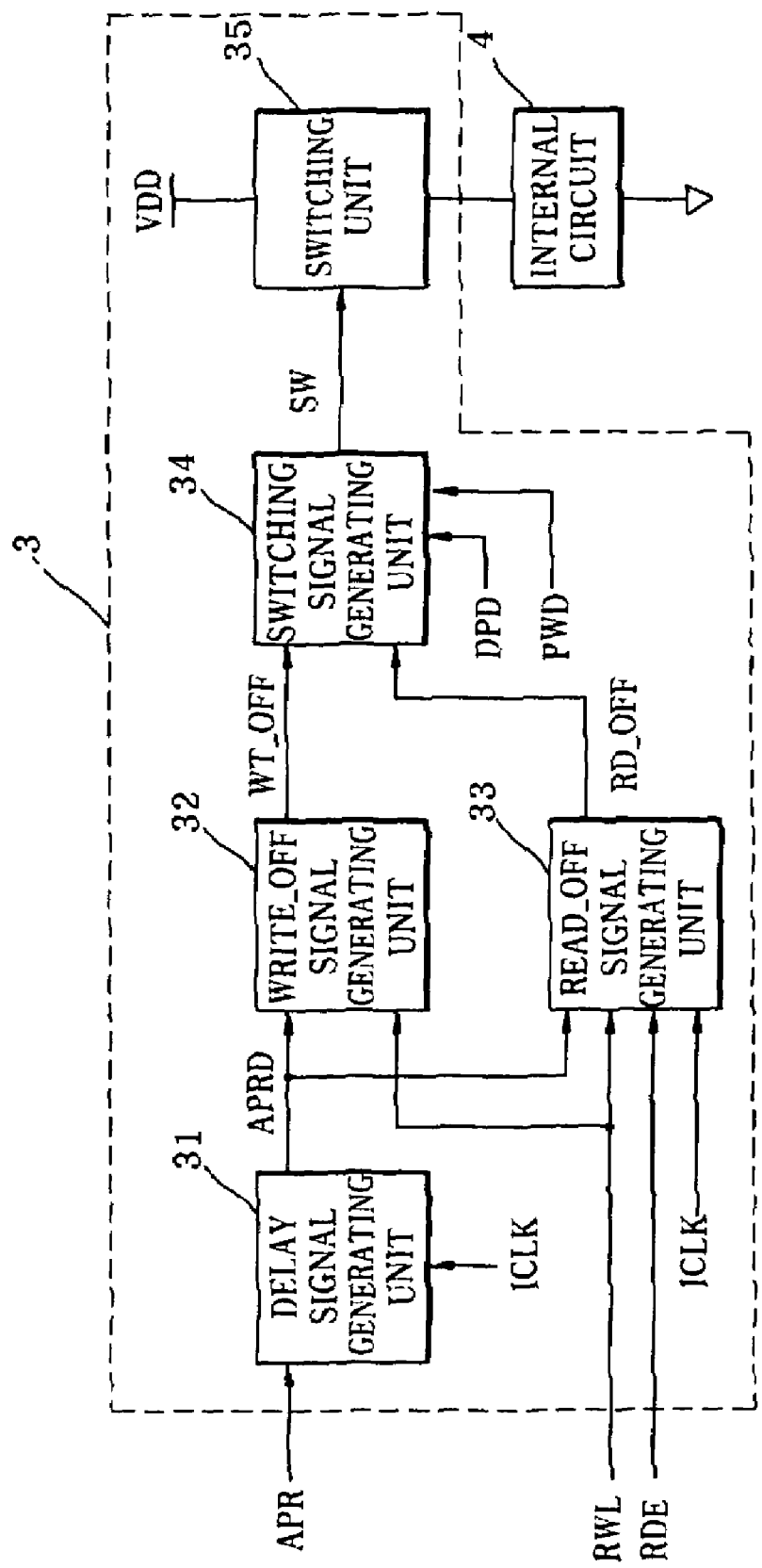
FIG. 2 is a block diagram illustrating a configuration of a semiconductor memory device in accordance with an embodiment of the present invention.

FIG. 2 is a block diagram illustrating a configuration of a semiconductor memory device in accordance with an embodiment of the present invention.

The semiconductor memory device of FIG. 2 comprises a power control circuit 3 and an internal circuit 4.

The power control circuit 3 comprises a delay signal generating unit 31, a write-off signal generating unit 32, a read-off signal generating unit 33, a switching signal generating unit 34 and a switching unit 35.

Figure 3:
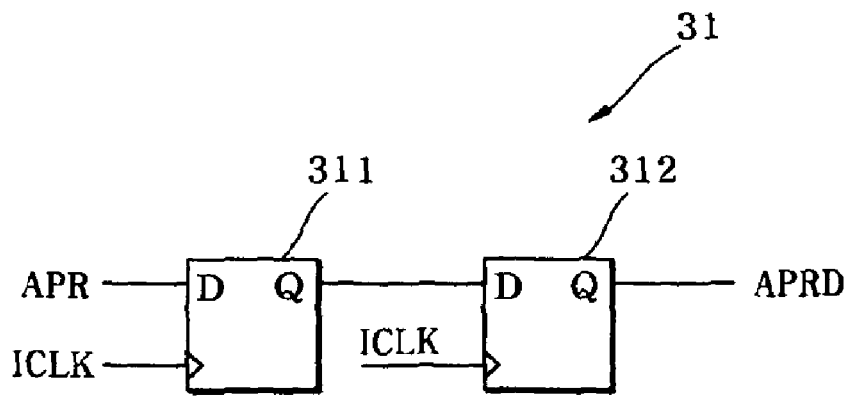
FIG. 3 is a circuit diagram illustrating a delay signal generating unit in the semiconductor memory device of FIG. 2.

The delay signal generating unit 31 can comprise, as illustrated in FIG. 3, a first D flip-flop 311 which delays an all bank precharge signal APR by a predetermined period synchronously with a clock signal ICLK and outputs a delayed signal, and a second D flip-flop 312 delays the output signal of the first D flip-flop 311 by a predetermined period synchronously with the clock signal ICLK and outputs an all bank precharge delay signal APRD. Here, the all bank precharge signal APR is disabled to a low level when at least one of the banks becomes an active state, and is enabled to a high level when all of the banks are precharged.

Figure 4A:
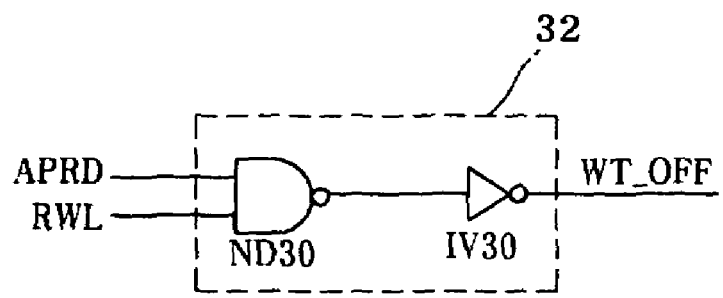
FIG. 4A illustrates an embodiment of a write-off signal generating unit in the semiconductor memory device of FIG. 2.

FIG. 4A illustrates an embodiment of the write-off signal generating unit 32.

Write-off signal generating unit 32, as illustrated in FIG. 4A, comprises a NAND gate ND30 which receives the all bank precharge delay signal APRD and a read-write level signal RWL and performs a logic NAND operation thereon, and an inverter IV30 which inverts the output signal of the NAND gate ND30 to generates a write-off signal WT_OFF. Here, the read-write level signal RWL is a signal which is shifted to a high level when a write command is inputted and is shifted to a low level when a read command is inputted.

Figure 4B:
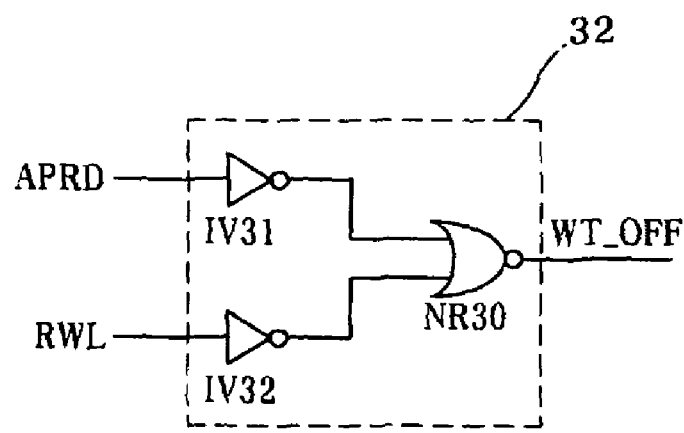
FIG. 4B illustrates another embodiment of a write-off signal generating unit in the semiconductor memory device of FIG. 2.

Write-off signal generating unit 32, as illustrated in FIG. 4B and corresponding to, another embodiment of the write-off signal generating unit 32, comprises an inverter IV31 which inverts the all bank precharge delay signal APRD and outputs an inverted signal, an inverter IV32 which inverts the read-write level signal RWL and outputs an inverted signal, and a NOR gate NR30 which receives output signals of the inverter IV31 and the inverter IV32 and performs a logic NOR operation thereon to generate the write-off signal WT_OFF.

In each embodiment, the write-off signal generating unit 32 receives the all bank precharge delay signal APRD and the read-write level signal RWL and generates the write-off signal WT_OFF. Also, the write-off signal WT_OFF is enabled to a high level when all of the banks are precharged, to shift the all bank precharge delay signal APRD to a high level in a state that the write command is inputted to shift the read-write level signal RWL to a high level.

Figure 5:
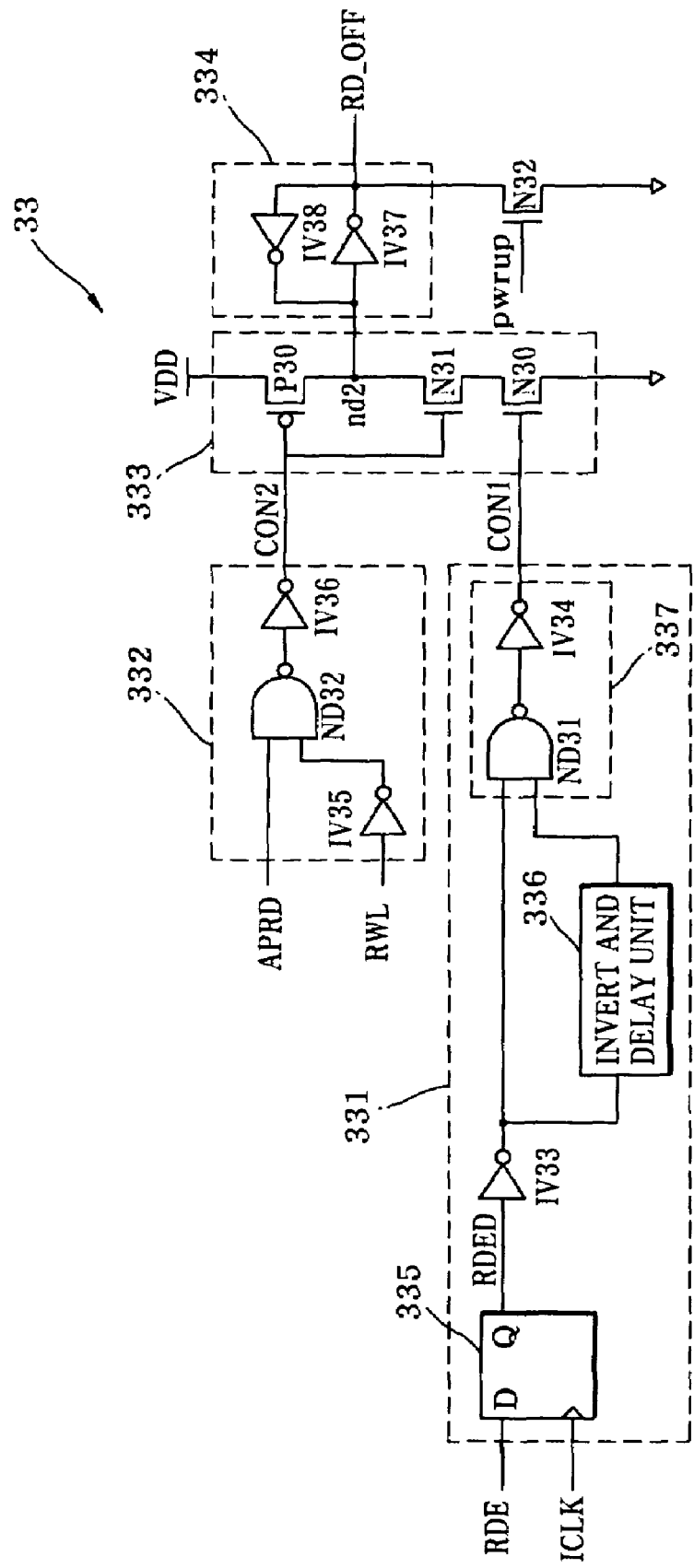
FIG. 5 is a circuit diagram illustrating a read-off signal generating unit in the semiconductor memory device of FIG. 2.

Meanwhile, the read-off signal generating unit 33 can comprise, as illustrated in FIG. 5, a first drive control signal generating unit 331, a second drive control signal generating unit 332, a driving unit 333 and a latch unit 334.

The first drive control signal generating unit 331 comprises a D flip-flop 335, an inverter IV33, an invert and delay unit 336 and a logic operating unit 337.

The D flip-flop 335 delays a read termination signal RDE inputted thereto synchronously with the clock signal ICLK, and outputs a read termination delay signal RDED.

The inverter IV33 inverts and buffers the read termination delay signal RDED and outputs the resulting signal. The invert and delay unit 336 delays the inverted signal (output by inverter IV33) of the read termination delay signal RDED by a predetermined delay period, inverts the delayed signal and outputs the inverted signal.

Also, the logic operating unit 337 receives the inverted signal (from the inverter IV33) of the read termination delay signal RDED and the output signal of the invert and delay unit 336, and performs a logic NAND operation thereon to generate a first drive control signal CON1. Here, the first drive control signal CON1 is outputted as a pulse having a high enable period corresponding to the predetermined delay period of the invert and delay unit 336, starting from a falling edge period of the read termination delay signal RDED The read termination signal RDE is a signal which is shifted to a high level when the read command is inputted, maintains a "high" state for a period corresponding to a CAS latency and a burst length and is shifted again to a low level. That is to say, the read termination signal RDE is disabled to a low level after the termination of the read operation.

The second drive control signal generating unit 332 receives the all bank precharge delay signal APRD and the read-write level signal RWL, generates a second drive control signal CON2, and comprises a NAND gate ND32 which performs a logic NAND operation on an inverted signal (from inverter IV35) of the read-write level signal RWL and the all bank precharge delay signal APRD, and an inverter IV36 which inverts the output signal of the NAND gate ND32 and generates the second drive control signal CON2. Here, the second drive control signal CON2 is enabled to a high level when the read command is inputted to shift the read-write level signal RWL to a low level and all of the banks are precharged to make the all bank precharge delay signal APRD a high level.

The driving unit 333 comprises NMOS transistors N30, N31 which pull down a node nd2 in response to the first drive control signal CON1 and the second drive control signal CON2, respectively, and a PMOS transistor P30 which pulls up the node nd2 in response to the second drive control signal CON2.

The latch unit 334 latches the signal of the node nd2 to generate the read-off signal RD_OFF. Also, the latch unit 334 initializes the read-off signal RD_OFF to a low level, in response to NMOS transistor N32 being turned on in a power up period upon power-on.

The read-off signal generating unit 33 configured as described above generates the read-off signal RD_OFF which is enabled to a high level when both the first drive control signal CON1 and the second drive control signal CON2 are enabled to a high level. That is to say, the read-off signal is enabled to a high level when the read operation is terminated and all of the banks are precharged.

Figure 6:
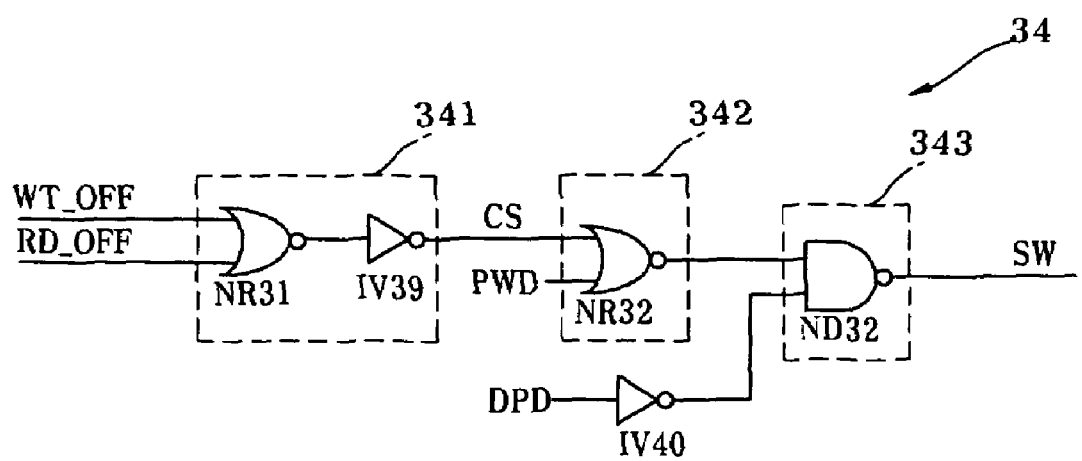
FIG. 6 is a circuit diagram illustrating a switching signal generating unit in the semiconductor memory device of FIG. 2.

The switching signal generating unit 34 receives the read-off signal RD_OFF and the write-off signal WT_OFF, generates a switching signal SW for controlling the switching unit 35, and can comprise, as illustrated in FIG. 6, a control signal generating unit 341, a power down mode determination unit 342 and a deep power down mode determination unit 343.

The control signal generating unit 341 includes a NOR gate NR31 and an inverter IV39 coupled to an output of the NOR gate NR31, and performs a logic OR operation on the read-off signal RD_OFF and the write-off signal WT_OFF to generate a control signal CS. The control signal CS is enabled to a high level when one of the read-off signal RD_OFF and the write-off signal WT_OFF is enabled to a high level.

The power down mode determination unit 342 comprises a NOR gate NR32 which performs a logic NOR operation on the control signal CS and the power down mode signal PWD. Also, the deep power down mode determination unit 343 comprises a NAND gate ND32 which receives an inverted signal (from inverter IV40) of the deep power down mode signal DPD and the output signal of the power down mode determine unit 342 and performs a logic NAND operation thereon to generate a switching signal SW.

That is to say, switching signal generating unit 34 generates the switching signal SW which is enabled to a high level not only when the write operation or the read operation is terminated and all of the banks are precharged, but also when entering into the power down mode or the deep power down mode.

Figure 7:
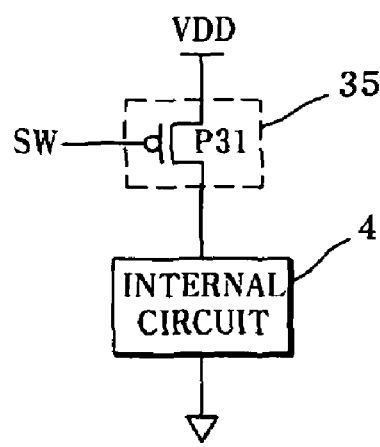
FIG. 7 is a circuit diagram illustrating a switching unit in the semiconductor memory device of FIG. 2.
Figure 8:
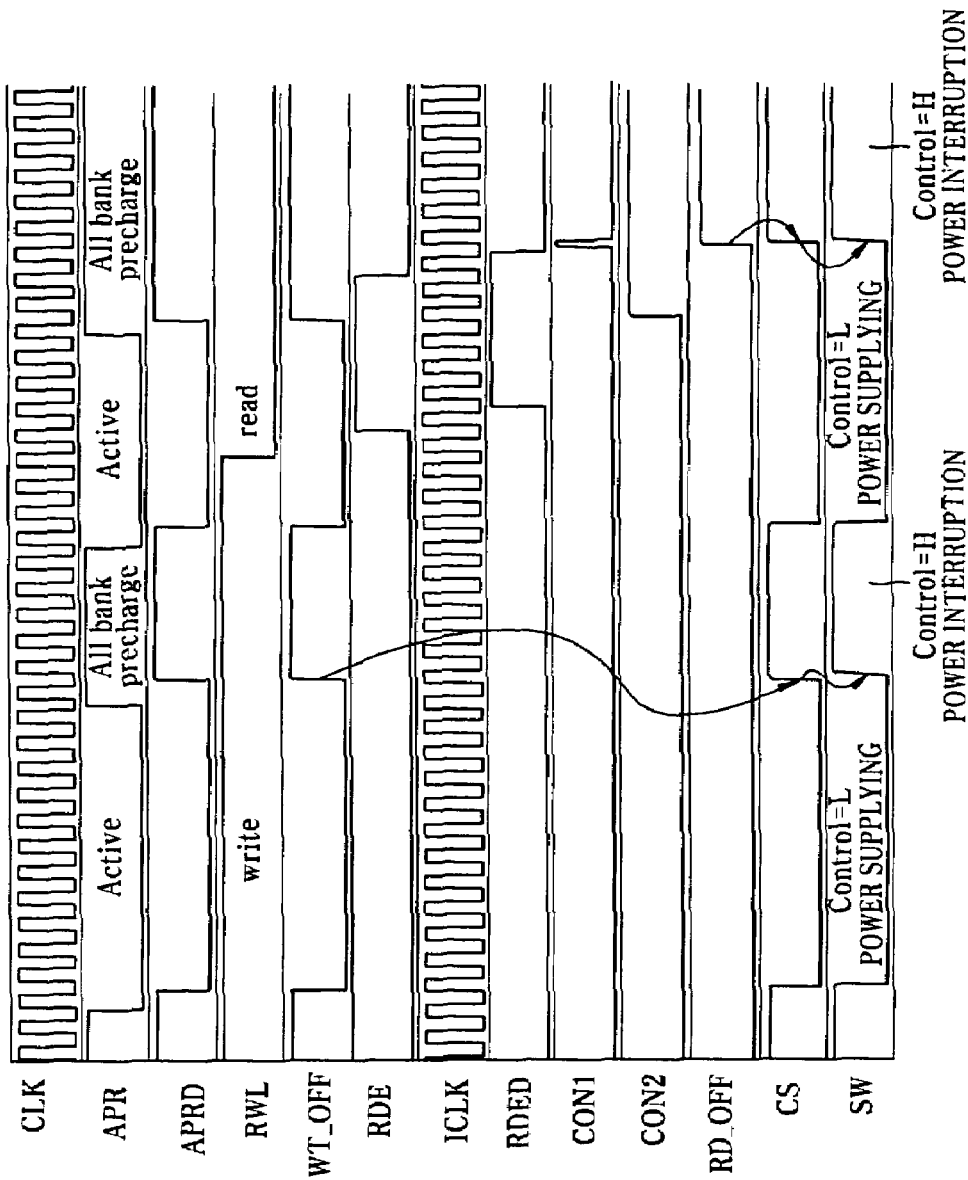
FIG. 8 is a timing diagram illustrating an operation of a power control circuit in accordance with an embodiment of the present invention.

The switching unit 35 can comprise, as illustrated in FIG. 7, a PMOS transistor P31 which controls the output of the power voltage VDD in response to the switching signal SW. That is to say, the switching unit 35 interrupts the output of the power voltage VDD not only when the write operation or the read operation is terminated and all of the banks are precharged, but also when entering into the power down mode or the deep power down mode.

An operation of the power control circuit configured as described above will be described with reference to FIGS. 2 to 8 with respect to the write operation and the read operation.

First, since all of the banks of the semiconductor memory device are in a precharge state before the write command or the read command is inputted, the all bank precharge signal APR is at a high level. At this time, the read-write level signal RWL maintains the level according to previously terminated operation. For example, if the previous operation is the read operation, the read-write level signal RWL is maintained at a low level.

More specifically, when the read-write level signal RWL is at a high level, the write-off signal generating unit 32 performs a logic AND operation on the all bank precharge signal APR of a high level and the read-write level signal RWL of a high level to generate the write-off signal WT_OFF enabled to a high level. The switching signal generating unit 34 generates the switching signal SW enabled to a high level in response to the write-off signal WT_OFF of a high level, regardless of the level of the read-off RD_OFF signal.

The read-write level signal RWL of a low level means that a prior operation was the read operation. Therefore, the first drive control signal generating unit 331 generates the first drive control signal CON1 enabled to a high level for the delay period of the invert and delay unit 336, starting from when the read operation is terminated, i.e. from the period where the read termination signal RDE is shifted from a high level to a low level. Also, the second drive control signal generating unit 332 receives the all bank precharge signal APR of a high level and the read-write level signal RWL of a low level, and generates the second drive control signal CON2. Therefore, the node nd2 of the driving unit 333 is driven to a low level and the read-off signal RD_OFF is enabled to a high level. Since the switching signal generating unit 34 generates the switching signal SW of a high level in response to the read-off signal RD_OFF regardless of the level of the write-off signal WT_OFF, the switching unit 35 interrupts the output of the power voltage VDD in response to the switching signal SW.

That is to say, the switching signal SW is outputted to a high level regardless of the level of the read-write level signal RWL before the read command or the write command is inputted and the switching unit 35 interrupts the output of the power voltage VDD in response to this switching signal SW.

Next, an operation of the power control circuit 3 in the write operation will be described.

When the write command is inputted, the bank performing the write operation becomes an active state and the all bank precharge signal APR is disabled to a low level and the read-write level signal RWL becomes a high level. Therefore, the write-off signal generating unit 32 generates the write-off signal WT_OFF disabled to a low level.

Meanwhile, the first drive control signal generating unit 331 of the read-off signal generating unit 33 receives the read termination signal RDE of a low level and generates the first drive control signal CON1 of a low level, and the second drive control signal generating unit 332 receives the all bank precharge delay signal APRD of a low level and the read-write level signal RWL of a high level and generates the second drive control signal CON2 of a low level. Therefore, since the PMOS transistor P30 is turned on and the node nd2 of the driving unit 333 is pulled up, the read-off signal RD_OFF is disabled to a low level. The switching signal generating unit 34 receives the write-off signal WT_OFF and the read-off signal RD_OFF of a low level and generates the switching signal SW of a low level, and the switching unit 35 is turned on to supply the power voltage VDD to the internal circuit 4. At this time, each of the power down mode signal PWD and the deep power down mode signal DPD is at a low level.

After that, when the write operation is terminated and all of the banks are precharged, the all bank precharge signal APR is shifted to a high level. At this time, the write-off signal generating unit 32 receives the all bank precharge delay signal APRD of a high level and the read-write level signal RWL of a high level to generate the write-off signal WT_OFF enabled to a high level. The switching signal generating unit 34 generates the switching signal SW of a high level in response to the write-off signal WT_OFF of a high level, and the switching unit 35 is turned off to interrupt the power voltage VDD supplied to the internal circuit 4. That is to say, when the write command is inputted, the power control circuit 3 supplies the power voltage VDD to the internal circuit 4 in the write operation period, but interrupts again the output of the power voltage VDD when the write operation is terminated and all of the banks are precharged.

Next, an operation of the power control circuit 3 in the read operation will be described.

When the read command is inputted, since the bank performing the read operation becomes an active state, the all bank precharge signal APR becomes a low level and the read-write level signal RWL becomes a low level. The write-off signal generating unit 32 generates the write-off signal WT_OFF disabled to a low level in response to the read-write level signal RWL of a low level, regardless of the level of the all bank precharge signal APR.

Meanwhile, the first drive control signal generating unit 331 of the read-off signal generating unit 33 receives the read termination signal RDE having a high-enabled period corresponding to the CAS latency CL and the burst length BL after the read command is inputted, and generates the first drive control signal CON1 having a high-enabled period corresponding to the delayed period of the invert and delay unit 336, starting from the period where the read termination signal RDE is disabled to a low level. Also, the second drive signal generating unit 332 receives the all bank precharge delay signal APRD of a low level and the read-write level signal RWL of a low level and generates the second drive control signal of a low level in the read operation period. Therefore, the node nd32 of the driving unit 333 is pulled up and the read-off signal WT_OFF is disabled to a low level.

The switching signal generating unit 34 generates the switching signal disabled to a low level in response to the write-off signal WT_OFF of a low level and the read-off signal RD_OFF of a low level. Since the switching unit 35 is turned on in response to the switching signal SW of a low level, the switching unit 35 supplies the power voltage VDD to the internal circuit 4.

After that, when the read operation is terminated, the first drive control signal generating unit 331 generates the first drive control signal CON1 having a high-enabled period corresponding to the delayed period of the invert and delay unit 336, starting from the period where the read termination signal RDE is disabled to a low level. Also, the second drive control signal generating unit 332 generates the second drive control signal CON2 enabled to a high level, since all of the banks are precharged to shift the all bank precharge signal to a high level and the read-write level signal RWL is maintained at a low level. Since the NMOS transistor N30 and the NMOS transistor N31 of the driving unit 333 are turned on in response to the first drive control signal CON1 of a high level and the second drive control signal CON2 of a high level, respectively, the read-off signal RD_OFF is enabled to a high level.

The switching signal generating unit 34 generates the switching signal SW of a high level in response to the read-off signal of a high level, and the switching unit 35 interrupts the output of the power voltage VDD in response to the switching signal SW of a high level. That is to say, the power control circuit 3 supplies the power voltage VDD to the internal circuit 4 in the read operation period, but interrupts the output of the power voltage VDD again when the read operation is terminated and all of the banks are precharged.

As is apparent from the above description, the power control circuit 3 in accordance with the present invention provides the power voltage VDD to the internal circuit 4 in the read operation period and the write operation period and interrupts the output of the power voltage VDD when the read operation and the write operation are terminated and all of the banks are precharged, thereby reducing the unnecessary current consumption.

While the present invention has been described with respect to the particular embodiments and examples, it will be apparent to those skilled in the art that various changes and modifications may be made without departing from the spirit and scope of the invention as defined in the following claims.

The present application claims priority to Korean application number 10-2008-0121187, filed on Dec. 2, 2008, which is incorporated by reference in its entirety.

What is claimed is:

1. A semiconductor memory device, comprising:
a write-off signal generating unit for generating a write-off signal which is enabled when write operation is terminated and all banks are precharged;
a read-off signal generating unit for generating a read-off signal which is enabled when read operation is terminated and all banks are precharged;
a switching signal generating unit for receiving the write-off signal and the read-off signal and generate a switching signal;
a switching unit for controlling the output of the power voltage in response to the switching signal; and
an internal circuit operating by the power voltage supplied thereto.

2. The semiconductor memory device of claim 1, wherein a level of the write-off signal is determined in response to an all bank precharge signal and a read-write level signal.

3. The semiconductor memory device of claim 2, wherein the read-write level signal is shifted to different levels according to a state of the write operation or the read operation.

4. The semiconductor memory device of claim 1, wherein the read-off signal generating unit comprises: a first drive control signal generating unit for generating a first drive control signal which is enabled for a predetermined period after termination of the read operation; a second drive control signal generating unit for generating a second drive control signal which is enabled when all of the banks are precharged after the termination of the read operation; a driving unit for receiving the first drive control signal and the second drive control signal and drive a node; and a latch unit for latching a signal of the node and generating the read-off signal.

5. The semiconductor memory device of claim 4, wherein the read-off signal is enabled when both the first drive control signal and the second drive control signal are enabled.

6. The semiconductor memory device of claim 4, wherein the first drive control signal generating unit comprises: a flip-flop for delaying a read termination signal inputted thereto by a predetermined period synchronously with a clock signal and outputting a read termination delay signal; an inverter for inverting and buffering the read termination delay signal and outputting a resulting output signal; an invert and delay unit for delaying the output signal of the inverter to obtain a delayed signal, inverting the delayed signal to generate an inverted signal and outputting the inverted signal; and a logic operating unit for performing a logic AND operation on the output signal of the inverter and an output signal of the invert and delay unit and generating the first drive control signal.

7. The semiconductor memory device of claim 6, wherein the first drive control signal has an enable period corresponding to a predetermined delay period of the invert and delay unit, starting from a period where the read termination delay signal is disabled.

8. The semiconductor memory device of claim 6, wherein an enable period of the read termination signal is maintained in accordance with a CAS latency and a burst length after the read command is inputted.

9. The semiconductor memory device of claim 1, wherein the switching signal is enabled when the read-off signal or the write-off signal is enabled.

10. The semiconductor memory device of claim 1, wherein the switching signal is enabled when entering into a deep power down mode or a power down mode.

11. The semiconductor memory device of claim 10, wherein the switching signal generating unit comprises:
a control signal generating unit for generating a control signal which is enabled when the read-off signal or the write-off signal is enabled;
a power down mode determination unit for performing a logic operation on the control signal and a power down mode signal; and
a deep power down mode determination unit for performing a logic operation on the output signal of the power down mode determination unit and a deep power down mode signal, and generating the switching signal.

12. The semiconductor memory device of claim 1, wherein the switching unit interrupts the output of the power voltage when the read-off signal or the write-off signal is enabled.

13. A power control circuit, comprising:
a write-off signal generating unit for generating a write-off signal which is enabled when write operation is terminated and all banks are precharged;
a read-off signal generating unit for generating a read-off signal which is enabled when read operation is terminated and all banks are precharged;
a switching signal generating unit for receiving the write-off signal and the read-off signal and generate a switching signal; and
a switching unit for controlling supply of a power voltage in response to the switching signal.

14. The power control circuit of claim 13, wherein a level of the write-off signal is determined in response to an all bank precharge signal and a read-write level signal.

15. The power control circuit of claim 14, wherein the read-write level signal is determined to different levels according to a state of the write operation or the read operation.

16. The power control circuit of claim 13, wherein the read-off signal generating unit comprises:
a first drive control signal generating unit for generating a first drive control signal which is enabled for a predetermined period after termination of the read operation;
a second drive control signal generating unit for generating a second drive control signal which is enabled when all of the banks are precharged after the termination of the read operation;
a driving unit for receiving the first drive control signal and the second drive control signal and drive a node; and
a latch unit for latching a signal of the node and generating the read-off signal.

17. The power control circuit of claim 16, wherein the read-off signal is enabled when both the first drive control signal and the second drive control signal are enabled.

18. The power control circuit of claim 16, wherein the first drive control signal generating unit comprises:
a flip-flop for delaying a read termination signal inputted thereto by a predetermined period synchronously with a clock signal and outputting a read termination delay signal;
an inverter for inverting and buffering the read termination delay signal and outputting a resulting output signal;
an invert and delay unit for delaying the output signal of the inverter to generate a delayed signal, inverting the delayed signal to generate an inverted signal and outputting the inverted signal; and a logic operating unit for performing a logic AND operation on the output signal of the inverter and an output signal of the invert and delay unit and generating the first drive control signal.

19. The power control circuit of claim 18, wherein the first drive control signal has an enable period corresponding to a delay period of the invert and delay unit, starting from a period where the read termination delay signal is disabled.

20. The power control circuit of claim 18, wherein an enabled period of the read termination signal is maintained in accordance with a CAS latency and a burst length after the read command is inputted.

21. The power control circuit of claim 13, wherein the switching signal is enabled when the read-off signal or the write-off signal is enabled.

22. The power control circuit of claim 13, wherein the switching signal is enabled when entering into a deep power down mode or a power down mode.

23. The power control circuit of claim 22, wherein the switching signal generating unit comprises:
   a control signal generating unit for generating a control signal which is enabled when the read-off signal or the write-off signal is enabled;
   a power down mode determination unit for performing a logic operation on the control signal and a power down mode signal; and
   a deep power down mode determination unit for performing a logic operating on the output signal of the power down mode determination unit and a deep power down mode signal, and generating the switching signal.

24. The power control circuit of claim 13, wherein the switching unit interrupts the output of the power voltage when the read-off signal or the write-off signal is enabled.

* * * * *